June 14, 1960 G. ABRAHAM 2,941,094

ELECTRICAL AMPLIFYING CIRCUIT

Filed Dec. 20, 1956 2 Sheets-Sheet 1

INVENTOR
GEORGE ABRAHAM

BY W.R. Mattig
Richard C. Reed
ATTORNEYS

June 14, 1960 G. ABRAHAM 2,941,094

ELECTRICAL AMPLIFYING CIRCUIT

Filed Dec. 20, 1956 2 Sheets-Sheet 2

INVENTOR
GEORGE ABRAHAM

BY

ATTORNEYS

United States Patent Office 2,941,094

Patented June 14, 1960

2,941,094

ELECTRICAL AMPLIFYING CIRCUIT

George Abraham, 3107 Westover Drive SE., Washington, D.C.

Filed Dec. 20, 1956, Ser. No. 629,761

1 Claim. (Cl. 307—88.5)

(Granted under Title 35, U.S. Code (1952), sec. 266)

The invention described herein may be manufactured and used by or for the Government of the United States of America for governmental purposes without the payment of any royalties thereon or therefor.

The present invention relates in general to a variable gain circuit and in particular to an electrical amplifying circuit.

In the field of electronics, an amplifying circuit may find many useful applications. By way of example, transmitters and receivers employ appropriate amplifying circuits to obtain a large signal output from a comparatively small signal input. The amplifying circuits used at present, however, have a number of disadvantages. For example, since each amplifier stage in a receiver requires a comparatively complicated arrangement using two terminal devices, electron tubes, or transistors, when several stages of amplification are utilized in a single receiver, the physical size and weight of the receiver will be appreciable. If electron tubes are used, the power consumption will be high and a large portion of the power applied to the receiver, because of low efficiency, will be dissipated as heat. If two terminal devices, such as thermistors are used in the amplifying circuit, it is difficult to obtain accurate control of the operation of the device in the circuit.

In accordance with the foregoing, an object of the present invention is to provide an amplifying circuit employing a minimum number of circuit elements and requiring a negligible amount of power.

Another object of the present invention is to provide an amplifying circuit, utilizing a two terminal device, that may be accurately controlled.

Another object of the present invention is to provide an amplifying circuit utilizing a two terminal device whose impedance may be accurately controlled.

Another object of the present invention is to provide an amplifying circuit utilizing a negative resistance element whose impedance can be varied over a wide range.

Another object of the present invention is to provide an amplifier in which there is little change in phase due to amplification of a low frequency signal.

Another object of the present invention is to provide an arrangement in which a source of dynamic B+ is applied to a variable impedance device to cause the storage of a steady state of electrical charge carriers in the variable impedance device and thereby convert the latter to a negative resistance element which may be used in an appropriate circuit to amplify incoming signals.

Other objects and many of the attendant advantages of this invention will be readily apparent as the same becomes better understood by reference to the following detailed description when considered in connection with the accompanying drawings wherein:

Fig. 1 discloses a first embodiment of the present invention;

Fig. 2 discloses a second embodiment of the present invention;

Fig. 3 discloses a third embodiment of the present invention;

As used in the present application, "dynamic B+" is defined as a continually varying potential applied to a selected nonlinear device to store energy therein and to enable the device to function as an amplifier and/or to exhibit a negative resistance characteristic. As an example, a source of dynamic B+ may be a source of recurring signals providing signals having a frequency or repetition rate greater than the reciprocal of the lifetime of electrical charge carriers injected into the variable impedance device to which the source of dynamic B+ is connected.

In accordance with the present invention, an arrangement is provided wherein a source of dynamic B+ is applied to a variable impedance device to inject electrical charge carriers into the variable impedance device at a rate greater than the electrical charge carriers decay due to recombination to maintain a steady state of stored electrical charge carriers in the variable impedance device. The stored electrical charge carriers are then used to convert the variable impedance device into a negative resistance element which in turn is employed in an amplifying circuit. The amplifying circuit in which the variable impedance device is used may be controlled by applying a source of input signals either to the source of dynamic B+ or in series with the variable impedance device, or across the variable impedance device, and an appropriate output circuit may be connected to the variable impedance device.

Since positive feedback in the variable impedance device is caused by the injection and storage of minority electrical charge carriers at the frequency of the dynamic B+, there is little change in phase due to amplification of the low frequency signals applied to the variable impedance device by the source of input signals.

Figures 1, 2, 3, 4A, 4B:
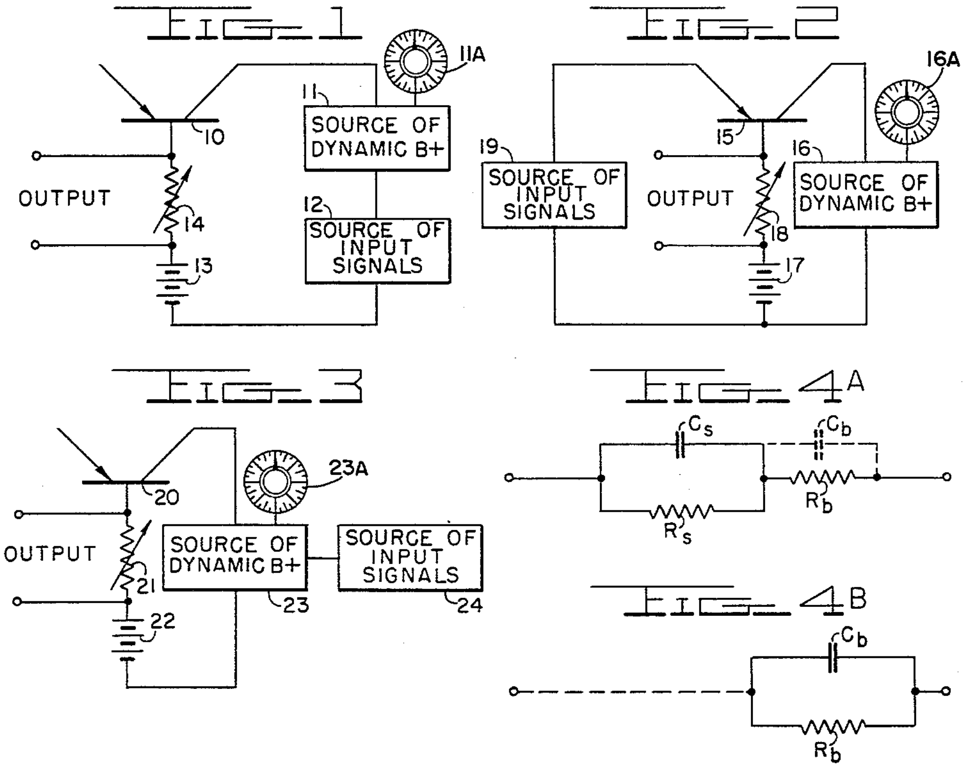
Fig. 4A represents the equivalent circuit of a transistor before dynamic B+ is applied.
Fig. 4B represents the equivalent circuit during the application of dynamic B+.

Referring to Fig. 1, it is noted that the first embodiment of the present invention comprises an amplifying circuit in which a source of dynamic B+ 11 is connected in series with a source of input signals 12, a source of direct current voltage 13, a variable resistor 14 and a variable impedance device 10. A control knob 11A, connected to the source of dynamic B+ 11, may be used to manually vary such parameters of the source of dynamic B+ as frequency, phase, duration and magnitude. The output of the amplifying circuit is connected across variable resistor 14.

Referring to Fig. 2, a second embodiment of the present invention is shown wherein the amplifying circuit comprises a variable impedance device 15, connected in series with a source of dynamic B+ 16, a source of direct current voltage 17, and a variable resistor 18. A source of input signals 19, is connected across the variable impedance device, the variable resistor, and the source of direct current voltage. A control knob 16A, connected to the source of dynamic B+ 16, may be used to vary such parameters of the source of dynamic B+ as frequency phase, duration and magnitude.

Now referring to Fig. 3, a third embodiment of the present invention is shown wherein a variable impedance device 20 is connected in series with a variable resistor 21, a source of direct current voltage 22, and a source of dynamic B+ 23. A source of incoming signals 24 is applied to the source of dynamic B+. The output is connected across the variable resistor 21. As in the above two embodiments a control knob 23A connected to the source of dynamic B+ 11 may be used to vary such parameters of the source of dynamic B+ as frequency, phase, duration and magnitude.

The variable impedance devices 10, 15, or 20, shown in Figs. 1, 2 or 3, respectively, may be any suitable devices wherein two or more electrical charge carriers having appropriate lifetimes are operative, for example, gaseous devices of the arc discharge type or semiconductor devices such as diodes, transistor triodes, transistor tetrodes or phototransistors. The electrical charge carriers may be any positive or negative charges such as electrons, ions, or holes, depending upon the type of variable impedance device used. The source of dynamic B+ may be any source of recurring signals so long as the frequency or repetition rate of the recurrying signals is greater than the reciprocal of the lifetime of injected electrical charge carriers and so long as a first element of each variable impedance device is driven positive with respect to a second element of the variable impedance device during one portion and is driven negative with respect to the second element during another portion of each cycle of operation.

In the embodiment of the present invention shown in Figs. 1, 2 or 3, a constant voltage, square wave generator is used as a source of dynamic B+, the variable impedance devices are point contact transistors of N-type material, and therefore, injected minority electrical charge carriers are holes. Other types of dynamic B+ could be used in combination with a selected variable impedance device to maintain a steady state of electrical charge carriers. For example, a high frequency sine wave oscillator could be used to inject and store electrons in a tetrode transistor having P-type base material.

In the operation of the amplifying circuit shown in Figs. 1, 2 or 3, the source of dynamic B+ 11, 16, or 23 is applied to variable impedance devices 10, 15 or 20 respectively; and after a few cycles of operation, the number of holes stored in the variable impedance devices reach a steady state. The source of input signals are then applied either in series with the source of dynamic B+ 11, the source of direct current voltage 13, the variable resistor 14, and the variable impedance device 10, as shown in Fig. 1; or the source of input signals is applied across the variable impedance device 15, the variable resistor 18, and the source of direct current voltage 17, as shown in Fig. 2; or the source of input signals is applied to the source of dynamic B+ 23, as shown in Fig. 3. The amplified output signal is then obtained across variable resistor 14, 18 or 21 as shown in Figs. 1, 2 or 3, respectively.

In order to understand the operation of the amplifying circuits shown in Figs. 1, 2 and 3, it is necessary to appreciate the relationship between several factors that affect the number of holes stored in the steady state. When the variable impedance device is a transistor these factors may be listed as follows: the transistor impedance, the load impedance, the bias, and the parameters of a source of dynamic B+ such as frequency, magnitude, phase and duration.

As indicated immediately above, the number of holes that will be stored in an N-type base material of a point contact transistor will be determined in part by the impedance of the transistor i.e., by the barrier capacitance, barrier resistance, base capacitance and base resistance of the transistor. As will be explained presently, the transistor impedance is not static but varies with or is modulated by the dynamic B+ applied to the transistor.

The transistor impedance is dependent in part on such factors as the lifetime of the electrical charge carriers and diffusion length in the base material of the transistor. These factors in turn are determined by the material used and the process of manufacturing the transistor. The impedance is also dependent in part on the conditions under which the transistor is operated in a particular circuit. This will become apparent during the analysis of Figs. 4A, 4B and 4C which, it will be recalled, represent the equivalent circuit of a transistor before, during and immediately after the application of dynamic B+.

Referring to Fig. 4A, when no dynamic B+ is applied to a transistor, if the transistor is a point contact unit having N-type, 5 ohm/cm. base material typical values may be as follows: the barrier capacitance $C_s$, approximately 3 $\mu\mu$f., barrier resistance $R_s$, approximately 10,000 ohms, base capacitance $C_b$, less than 0.1 $\mu\mu$f., which normally may be neglected, and the base resistance $R_b$, approximately 100 ohms. The value of each impedance will be determined in part by the material used and the process of manufacture of the point contact transistor.

When a large magnitude, square wave signal having, for example, a frequency of 1 mc. and a 50% duty cycle is applied, as dynamic B+, to a transistor, as the signal increases to its positive maximum value, there is considerable diffusion of electrical charge carriers into the base, and the value of the base capacitance $C_b$ becomes relatively large, approximately 350 $\mu\mu$f. The base resistance $R_b$ becomes smaller, approximately 60 ohms, as shown in Fig. 4B; these values cannot be neglected. The barrier capacitance $C_s$, because of the increased storage of electrical charge carriers, becomes larger, approximately 200 $\mu\mu$f. but the barrier resistance $R_s$ approaches zero, shunting out the increased barrier capacitance $C_s$. The barrier capacitance $C_s$ and barrier resistance $R_s$ may, therefore, be neglected as shown in Fig. 4B.

Figures 4C, 5:
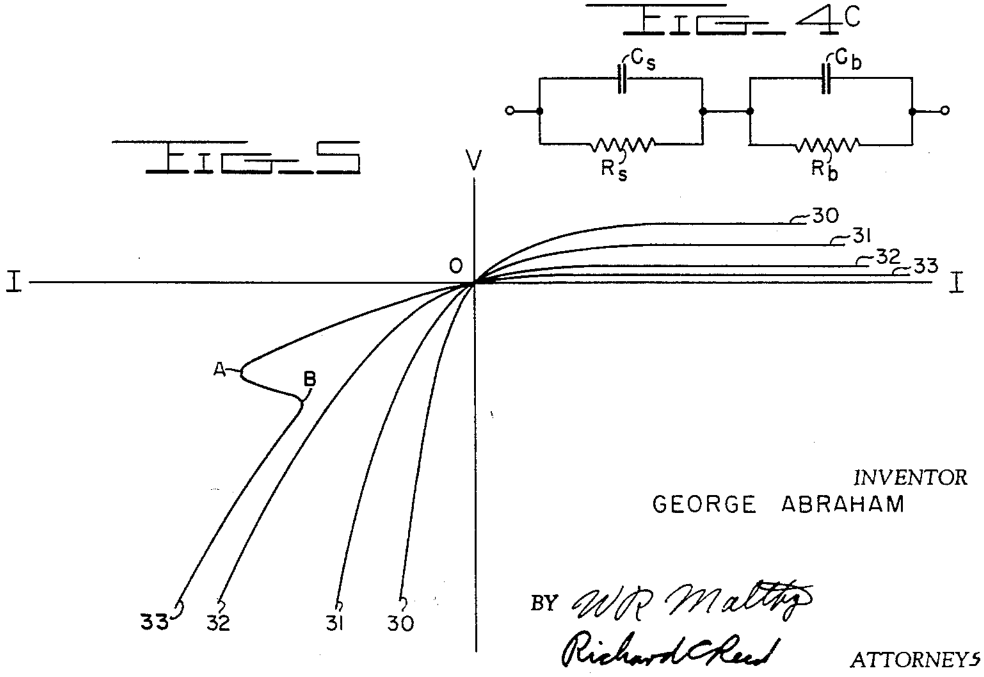
Fig. 4C represents the equivalent circuit immediately after the dynamic B+ has been removed from the transistor.
Fig. 5 represents a family of characteristic curves, including a negative resistance curve, for the variable impedance devices shown in Figs. 1, 2, 3.

As shown in Fig. 4C, when the dynamic B+ goes to zero, the barrier capacitance $C_s$ instantaneously returns from the larger value of 200 $\mu\mu$f. to the smaller value of 3 $\mu\mu$f. and the barrier resistance $R_s$ instantaneously returns from approximately zero to 100 ohms. The base resistance $R_b$, however, returns slowly from the smaller value of 60 ohms to the larger value of 100 ohms and the base capacitance returns slowly from the larger value of 350 $\mu\mu$f. to the smaller value of 0.2 $\mu\mu$f. Before the base capacitance $C_b$ can attain its smaller value another cycle of dynamic B+ is applied to the transistor to return the base capacitance $C_b$ to its larger value. If a series of cycles are applied by a source of dynamic B+ to the transistor at a frequency greater than the reciprocal of the lifetime of the injected electrical charge carriers, after a few cycles of operation, the base capacitance $C_b$ will attain an average value. The number of electrical charge carriers stored in the base capacitance $C_b$ will, likewise, attain an average value or steady state that will be dependent in part upon the magnitude, duration, and frequency of the dynamic B+ applied to the transistor.

Figure 7:
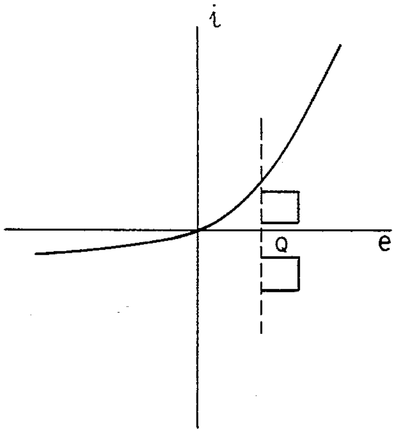
Fig. 7 represents the static barrier resistance characteristic curve of a transistor.
Figure 8:
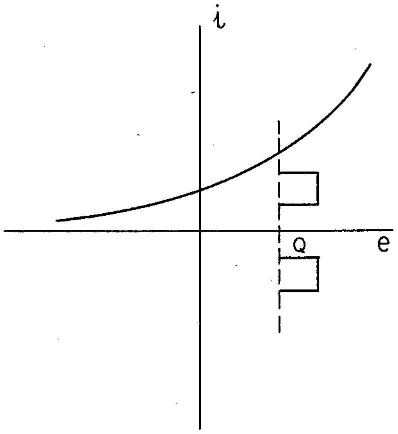
Fig. 8 represents the static barrier capacitance characteristic curve of a transistor.

Referring to Figs. 7 and 8, it is noted that the static barrier capacitance and static barrier resistance characteristic of a transistor are nonlinear and that the quiescent value of the barrier capacitance and resistance are dependent upon the bias applied to the transistor. The dynamic barrier capacitance and the dynamic resistance characteristic of the transistor will also be nonlinear and similar in shape to the curves for the respective static characteristics but the shape of the dynamic curves will also be dependent on dynamic operating conditions such as the number of holes stored in the steady state, the load and bias applied to the transistor as well as the characteristic of the transistor itself. For example, the steepness of the dynamic barrier capacitance curve will increase at a given bias as the number of holes stored in the steady state is increased. However, from the static characteristics shown in Figs. 7 and 8, it is seen that when dynamic B+ is applied to the transistor, the barrier capacitance and barrier resistance vary in dependency upon the magnitude of the dynamic B+. Similar relationships exist between the magnitude of the dynamic B+ and the dynamic barrier capacitance and resistance of the transistor and these relationships determine in part the magnitude of the steady state as explained in connection with Figs. 4A, 4B and 4C.

The number of electrical charge carriers stored in the steady state is dependent in part upon the value of the load impedance and consequently may be varied by changing the value of load impedance. Hence, in Figs. 1, 2 and 3 the magnitude of the steady state may be controlled by variable resistors 14, 18 and 21, respectively.

As will become apparent in the discussion below, the number of electrical charge carriers stored in the steady state will affect the shape of the voltage-current characteristic curve of variable impedance devices 10, 15 and 20 in the amplifying circuits shown in Figs. 1, 2 and 3, respectively.

Referring to Fig. 5, curve 30 represents the voltage-current characteristic curve of variable impedance devices 10, 15 or 20, shown in the circuits shown in Figs. 1, 2 or 3, respectively, when the magnitude of the dynamic B+ applied to the variable impedance devices is zero. Curves 30 and 31 represent the voltage-current characteristic when a relatively small magnitude of dynamic B+ is applied and curves 32 and 33 represent the voltage-current characteristic when the relative magnitude of dynamic B+ is increased, the magnitude of dynamic B+ applied to obtain curve 33 being greater than the magnitude applied to obtain curve 32. It is noted that as the magnitude of dynamic B+ is increased, the conductivity of the variable impedance devices i.e., the current flow through the variable impedance devices, per unit of voltage applied, increases. This, in effect, is feedback which results in regeneration and is attributed to the storage of electrical charge carriers. Thus, in the circuit shown in Figs. 1, 2 or 3 as the magnitude of the dynamic B+ is increased, the number of stored electrical charge carriers is increased due to greater diffusion into the body of the base material and curve 30 assumes the position of curve 32.

As the magnitude of the dynamic B+ applied to the circuits shown in Figs. 1, 2 or 3, is increased further and the voltage across the variable impedance devices is increased proportionally, regeneration causes a part of curve 32 to assume the position of OA of curve 33; and as the voltage across the variable impedance devices is increased still further, regeneration is increased until with sufficient regeneration negative resistance appears at point A on the curve 33. Thereafter, additional increases in voltage across the variable impedance devices will form the negative resistance portion AB of curve 33.

Similar results could be obtained by maintaining the magnitude of the dynamic B+ constant and changing another factor that controls the number of electrical charge carriers stored, such as, the duration or frequency of the dynamic B+. The characteristic depicted in curve 33 is generally termed in the art as an "S" type, "voltage controlled," or "short circuit stable" negative resistance characteristic. For purposes of the present disclosure, the term "short circuit stable" is employed to define this type of negative resistance characteristic.

Figure 6:
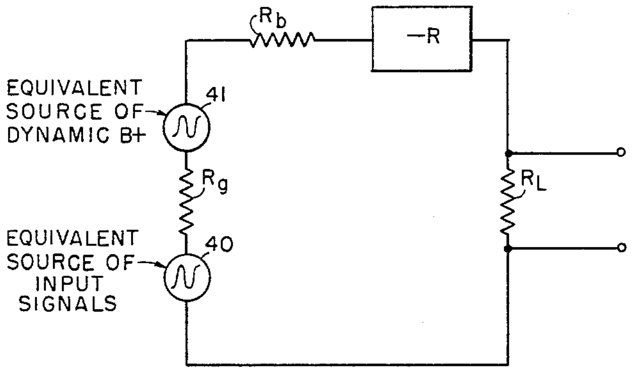
Fig. 6 represents an equivalent circuit of the embodiment of the present invention shown in Fig. 1.

Thus, it is seen that the circuits shown in Figs. 1, 2 or 3 may be controlled to obtain a negative resistance curve. The negative resistance curve in turn may be used to amplify the signals applied by the sources of input signals 12, 19 or 24, respectively. This will be explained with reference to Fig. 6, which, it will be recalled, is the equivalent circuit of the embodiment of the present invention shown in Fig. 1. In Fig. 6, the load $R_L$ is connected in series with the equivalent source of input signals 40, the internal resistance $Rg$ of the source of input signals, the equivalent source of dynamic B+ 41, the internal resistance of the source of dynamic B+ $Rb$, and the negative resistance $-R$ which is the equivalent of variable impedance device 10 when operated in the circuit shown in Fig. 1.

Now, if $R_L$ is assumed to be equal to $Rg$ and $Rb$, the current flowing in the circuit due to the applied signal voltage $(e)$ is: $i=e/(3Rg-R)$; the output voltage is $eRg/3Rg-R$; and the gain due to the negative resistance is $3Rg/(3Rg-R)$. Thus, it is seen that the first embodiment shown in Fig. 1 may under proper operating conditions be operated as a negative-resistance amplifier. A similar line of reasoning may be followed to show that the second and third embodiments of the present invention shown in Figs. 2 and 3, respectively, may likewise be operated as negative-resistance amplifiers.

It should be understood, of course, that the foregoing disclosure relates to only preferred embodiments of the invention and that numerous modifications or alterations may be made therein without departing from the spirit and scope of the invention as set forth in the appended claim.

What is claimed is:

In an electrical amplifying circuit, a transistor having at least an emitter, collector and base, a source of input signals to be amplified, means for applying said source of input signals to said emitter, a load impedance element, a source of bias, means for connecting said load impedance element and said source of bias between said collector and base, an output circuit connected across said load impedance element, and high frequency signal generating means connected to said collector for applying a series of pulses to the collector having a selected period such that the collector is forward biased with respect to the base during each period, whereby minority carriers are injected into said base, each pulse having a magnitude and said series of pulses having a repetition rate greater than the reciprocal of the lifetime of the minority charge carriers whereby a short circuit stable type of negative resistance characteristic is obtained.

References Cited in the file of this patent

UNITED STATES PATENTS

| | | |
|---|---|---|
| 2,418,516 | Lidow | Apr. 8, 1947 |
| 2,469,569 | Ohl | May 10, 1949 |
| 2,565,497 | Harling | Aug. 28, 1951 |
| 2,577,803 | Pfann | Dec. 11, 1951 |
| 2,585,571 | Mohr | Feb. 12, 1952 |
| 2,627,575 | Meacham et al. | Feb. 8, 1953 |
| 2,644,892 | Gehman | July 7, 1953 |
| 2,644,893 | Gehman | July 7, 1953 |
| 2,647,995 | Dickinson | Aug. 4, 1953 |
| 2,666,816 | Hunter | Jan. 19, 1954 |
| 2,714,702 | Shockley | Aug. 2, 1955 |
| 2,843,765 | Aigrian | July 15, 1958 |

FOREIGN PATENTS

| | | |
|---|---|---|
| 160,213 | Australia | Dec. 10, 1954 |

OTHER REFERENCES

"Diode Amplifier," National Bureau of Standards Technical News Bulletin, vol. 38, No. 10, October 1954, pp. 145–148.